(12) United States Patent
Lee et al.

(10) Patent No.: US 8,796,538 B2
(45) Date of Patent: Aug. 5, 2014

(54) SOLAR CELL AND METHOD FOR MANUFACTURING THE SAME

(75) Inventors: Youngsik Lee, Seoul (KR); Kyungchan Kang, Seoul (KR); Hwanyeon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 64 days.

(21) Appl. No.: 13/207,216

(22) Filed: Aug. 10, 2011

(65) Prior Publication Data

US 2011/0290323 A1 Dec. 1, 2011

(30) Foreign Application Priority Data

Dec. 17, 2010 (KR) ........................ 10-2010-0129715

(51) Int. Cl.
*H01L 31/022458* (2006.01)

(52) U.S. Cl.
USPC ........................................... 136/256

(58) Field of Classification Search
CPC .............................................. H01L 31/022458
See application file for complete search history.

(56) References Cited

U.S. PATENT DOCUMENTS

| 5,593,901 | A | * | 1/1997 | Oswald et al. | 438/80 |
| 6,144,083 | A | * | 11/2000 | Yin | 257/437 |
| 2008/0276981 | A1 | * | 11/2008 | Kinoshita et al. | 136/244 |
| 2009/0223560 | A1 | | 9/2009 | Kim | |
| 2009/0314346 | A1 | * | 12/2009 | Hishida | 136/258 |
| 2010/0258177 | A1 | | 10/2010 | Ko et al. | |
| 2010/0319766 | A1 | * | 12/2010 | Suh | 136/256 |
| 2011/0120548 | A1 | * | 5/2011 | Chen et al. | 136/256 |

FOREIGN PATENT DOCUMENTS

| EP | 1995792 A2 | 11/2008 |
| EP | 2043161 A2 | 4/2009 |
| EP | 2068369 A1 | 6/2009 |
| EP | 2086015 A2 | 8/2009 |

\* cited by examiner

*Primary Examiner* — Jennifer Michener
*Assistant Examiner* — Magali P Slawski
(74) *Attorney, Agent, or Firm* — Birch, Stewart, Kolasch & Birch, LLP

(57) ABSTRACT

A solar cell is discussed. The solar cell includes a substrate of a first conductivity type, the substrate having a via hole, an emitter disposed at the substrate and having a second conductivity type opposite the first conductivity type, an anti-reflection layer disposed on a first surface of the substrate and inside the via hole, a first electrode disposed on the first surface of the substrate and in the via hole, a first electrode bus bar disposed on a second surface of the substrate that is opposite the first surface and in the via hole, and a second electrode disposed on the second surface of the substrate and connected to the substrate.

11 Claims, 6 Drawing Sheets

SOLAR CELL AND METHOD FOR MANUFACTURING THE SAME

This application claims priority to and the benefit of Korean Patent Application No. 10-2010-0129715 filed in the Korean Intellectual Property Office on Dec. 17, 2010, the entire contents of which are incorporated herein by reference.

BACKGROUND OF THE INVENTION

1. Field of the Invention

Embodiments relates to a solar cell and a method for manufacturing the same.

2. Description of the Related Art

Recently, as exhaustion of existing natural resources such as petroleum and coal is anticipated, interest in alternative energy is getting higher, and in this respect, solar cells producing electric power from solar energy are getting attention. Among the solar cells, a back contact type solar cell is being developed, which improves efficiency of the solar cell by increasing a light receiving area in such a way to form both of an electrode for outputting electrons to an external device and an electrode for outputting holes to the external device on the back surface of a substrate, namely on the surface located in the opposite of the surface on which light rays are incident.

SUMMARY OF THE INVENTION

Embodiments of the invention provide a solar cell and a method for manufacturing the same capable of improving efficiency of the solar cell and reducing a manufacturing time of the solar cell.

In one aspect there is a solar cell including a substrate of a first conductivity type, the substrate having a via hole, an emitter disposed at the substrate and having a second conductivity type that is opposite the first conductivity type, an anti-reflection layer disposed on a first surface of the substrate and inside the via hole, a first electrode disposed on the first surface of the substrate and in the via hole, a first electrode bus bar disposed on a second surface of the substrate that is opposite the first surface and in the via hole, and a second electrode disposed on the second surface of the substrate and connected to the substrate.

A position of an end part of the anti-reflection layer inside the via hole may be lower than a position of an end part of the first electrode extending from the first surface to the inside of the via hole.

The anti-reflection layer may include at least one layer.

The anti-reflection layer may include at least one of silicon nitride, silicon oxide, aluminum oxide, titanium oxide, and silicon oxynitride.

The anti-reflection layer may include a plurality of layers, and a number of layers of the anti-reflection layer existing inside the via hole at a position that is closer to the first surface of the substrate is greater than a number of layers of the anti-reflection layer existing inside the via hole at a position that is farther to the first surface of the substrate.

The solar cell according to the aspect may further include a second bus bar disposed on the second surface of the substrate and connected to the second electrode.

The first surface may be a light incident surface of the solar cell.

Inside the via hole, the first electrode bus bar may contact a portion of the anti-reflection layer that is inside the via hole.

The anti-reflection layer may include a first portion that is disposed on the first surface of the substrate, and a second portion that is inside the via hole, and wherein the first portion may be discontinuous from the second portion.

A portion of the first electrode bus bar that is disposed in the via hole may cover the second portion of the anti-reflection layer.

The second portion of the anti-reflection layer may contact a portion of the first electrode that is in the via hole, a portion of the first electrode bus bar that is in the via hole, and a portion of the emitter layer that is in the via hole.

In another aspect there is a method for manufacturing a solar cell including forming a via hole in a substrate of a first conductivity type, forming an emitter of a second conductivity type that is opposite the first conductivity type at the substrate, forming an anti-reflection layer on a first surface of the substrate and inside the via hole, forming a bus bar pattern on a second surface of the substrate that is opposite the first surface and inside the via hole by using a first paste, forming a first electrode pattern connected to the bus bar pattern on the first surface and inside the via hole by using a second paste, forming a second electrode pattern on the second surface by using a third paste, and by applying a heat treatment to the substrate with the bus bar pattern, the first electrode pattern and the second electrode pattern, respectively forming a first electrode connected to the emitter by penetrating the anti-reflection layer, a bus bar connected to the first electrode through the via hole, and a second electrode connected to the substrate.

The first, second and third pastes may be different from each other.

The first paste may contain a same metal component as the second paste, but a different metal component from the third paste.

The first and second pastes may contain silver (Ag) and the third paste contains aluminum (Al).

Inside the via hole, a position of an end part of the anti-reflection layer may be lower than a position of an end part of the first electrode pattern extending from the first surface of the substrate to the inside of the via hole.

The forming of the anti-reflection layer may form the anti-reflection layer with at least one layer.

The forming of the anti-reflection layer may form the anti-reflection layer including at least one of silicon nitride, silicon oxide, aluminum oxide, titanium oxide, and silicon oxynitride.

The forming of the anti-reflection layer may form the anti-reflection layer with a plurality of layers, and wherein a number of layers of the anti-reflection layer existing inside the via hole at a position that is closer to the first surface of the substrate may be greater than a number of layers of the anti-reflection layer existing inside the via hole at a position that is farther to the first surface of the substrate.

The anti-reflection layer may be formed to include a first portion that is disposed on the first surface of the substrate, and a second portion that is inside the via hole, and wherein the first portion may be discontinuous from the second portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
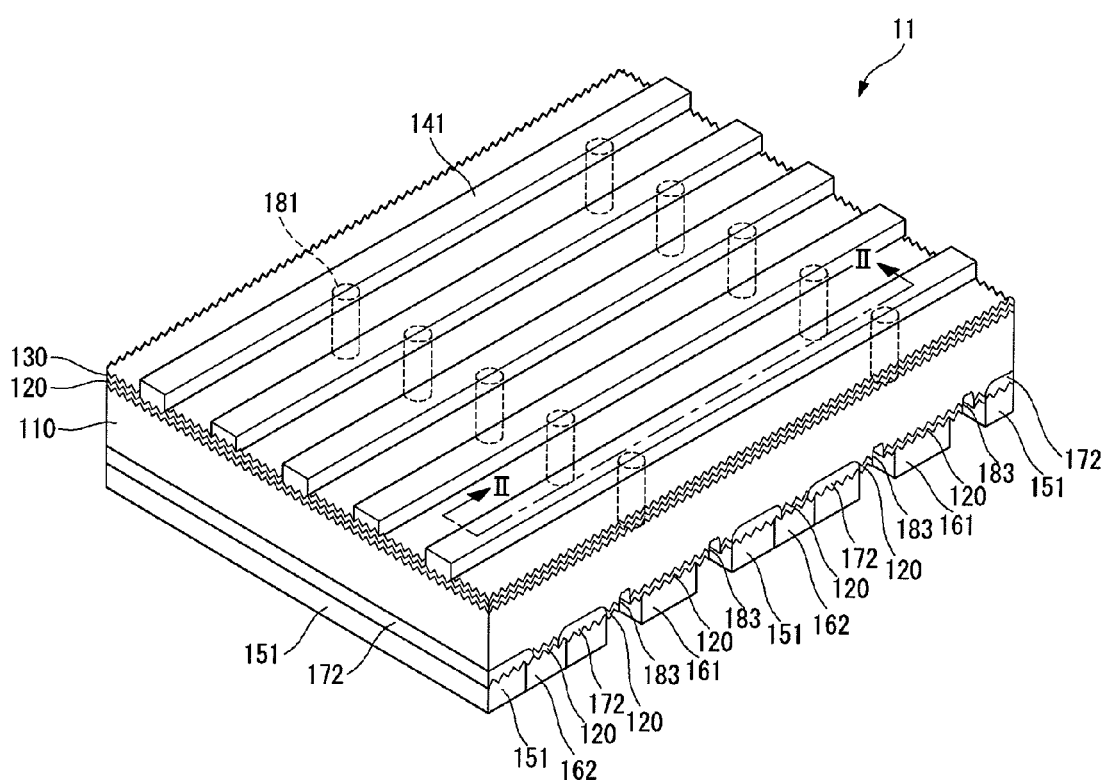
FIG. 1 is a partial perspective view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a solar cell according to an example embodiment of the invention will be described with reference to FIGS. 1 and 2.

Figure 2:
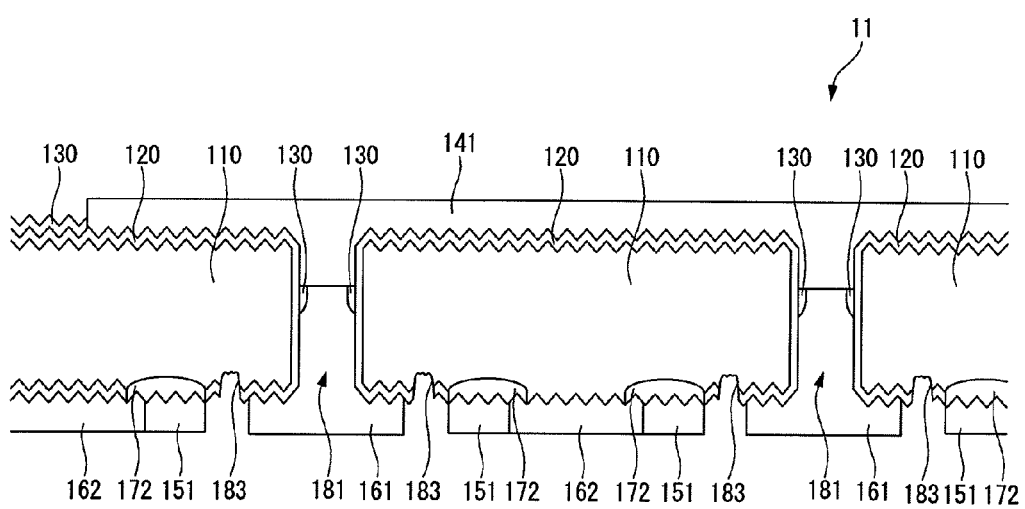
FIG. 2 is a cross sectional view obtained by cutting the solar cell of FIG. 1 along II-II line.

With reference to FIGS. 1 and 2, a solar cell 11 according to an embodiment of the invention comprises a substrate 110 having a plurality of via holes 181, an emitter 120 disposed in (at) the substrate 110, an anti-reflection layer 130 disposed on the emitter 120 of a surface (hereinafter, referred to as a 'front surface') of the substrate 110, where the front surface is a light incident surface, a plurality of front electrodes 141 disposed on the emitter 120 of the front surface of the substrate 110 in which the anti-reflection layer 130 is not disposed, a back electrode 151 disposed on another surface (hereinafter, referred to as a 'back surface') of the substrate 110, where the back surface is disposed opposite to the front surface of the substrate 110, on which light rays are incident, a plurality of bus bars (hereinafter, referred to as 'a plurality of front electrode bus bars') 161 for the plurality of front electrodes 141, disposed in the via holes 181 and on the emitter 120 around the via holes 181 of the back surface of the substrate 110, and connected electrically to the plurality of front electrodes 141, a plurality of bus bars (hereinafter, referred to as 'a plurality of back electrode bus bars') 162 for the back electrode 151 disposed on the back surface of the substrate 110, and connected electrically to the back electrode 151, and a back surface field (BSF) unit 172 disposed at the back surface of the substrate 110.

The substrate 110 is a substrate of a first conductivity type, e.g., a semiconductor substrate made of a semiconductor such as p-type silicon. In this instance, semiconductor is a crystalline semiconductor such as polycrystalline or monocrystalline silicon.

When the substrate 110 is of a p-type, the substrate 110 includes impurities of a group III element such as boron (B), gallium (Ga), and indium (In). Alternatively, the substrate 110 may be of an n-type, and/or be formed of materials other than silicon. When the substrate 110 is of the n-type, the substrate 110 may include impurities of a group V element such as phosphor (P), arsenic (As), and antimony (Sb).

The front surface of the substrate 110 is textured, having an irregular textured surface. For the sake of convenience, FIG. 1 depicts only the periphery of the substrate 110 as being formed with a textured surface, and depicts only the periphery of the anti-reflection layer 130 disposed on a top thereof as being formed with an irregular surface. However, in fact, the entire surface of the substrate 110 has a textured surface, and due to this reason, the anti-reflection layer 130 disposed on the top of the front surface also has an irregular surface. In an alternative example, not only the front surface, but also the back surface of the substrate 110 can have a textured surface.

Due to the textured surface of the substrate 110 having a plurality of irregularities, the surface area of the substrate 110 increases, to thereby increasing an area of a light incident surface and decreasing an amount of light reflected by the substrate 110, and therefore, the amount of light incident on the substrate 110 is increased.

The emitter 120 is an impurity area having a second conductivity type which is opposite to the conductivity type of the substrate 110, and is, for example, an n-type. Due to this, the emitter 120 forms a p-n junction with the first conductivity type part of the substrate 110.

Due to the built-in potential difference caused by the p-n junction between the substrate 110 and the emitter 120, electron-hole pairs, which are electric charges generated by the light rays incident on the substrate 110, are separated into electrons and holes, and the electrons move to the n-type semiconductor and the holes move to the p-type semiconductor. Therefore, when the substrate 110 is of the p-type and the emitter 120 is of the n-type, the holes move toward the substrate 110 and the electrons move toward the emitter 120.

Since the emitter 120 forms the p-n junction with the substrate 110, in a different embodiment of the invention, when the substrate 110 is of the n-type, and the emitter 120 is of the p-type, the electrons move to the substrate 110 while the holes move to the emitter 120.

In this embodiment of the invention, when the emitter 120 is of the n-type, the emitter 120 can be doped with impurities of a group V element, whereas in the different embodiment of the invention, when the emitter 120 is of the p-type, the emitter 120 can be doped with impurities of a group III element.

The anti-reflection layer 130 disposed on the emitter 120 of the front surface of the substrate 110 is made of one from among silicon nitride (SiNx), silicon oxide (SiOx), aluminum oxide ($Al_2O_3$), titanium oxide ($TiO_2$), and silicon oxynitride (SiOxNy).

The anti-reflection layer 130 reduces reflectivity of light incident on the solar cell 11 and increases selectivity of particular wavelengths (or bands of wavelengths) of the incident light, thereby increasing the efficiency of the solar cell 11.

Also, the anti-reflection layer 130 performs a passivation function through hydrogen (H) that was injected when the anti-reflection layer 130 was being formed. In other words, as defects such as dangling bonds existing near and on the surface of the substrate 110 change to stable bonds due to the hydrogen (H), improvement in the passivation function of the anti-reflection layer 130 in reducing disappearance of charges which have moved toward the surface of the substrate 110 due to the defects is made possible. Therefore, since the amount of charges lost near and on the surface of the substrate 110 due to the defect is reduced, efficiency of a solar cell 11 is improved.

FIG. 1 shows the anti-reflection layer 130 having a single layered structure, but in other embodiments, the anti-reflection layer 130 may have a multi-layered structure such as a double or a triple layered structure. When the anti-reflection layer 130 has a multi-layered structure, each layer of the anti-reflection layer 130 may be made of one from among silicon nitride (SiNx), silicon oxide (SiOx), aluminum oxide ($Al_2O_3$), titanium oxide ($TiO_2$), and silicon oxynitride (SiOxNy).

In one embodiment of the invention, the anti-reflection layer 130, as shown in FIG. 2, is disposed at each via hole 181.

Figure 4:
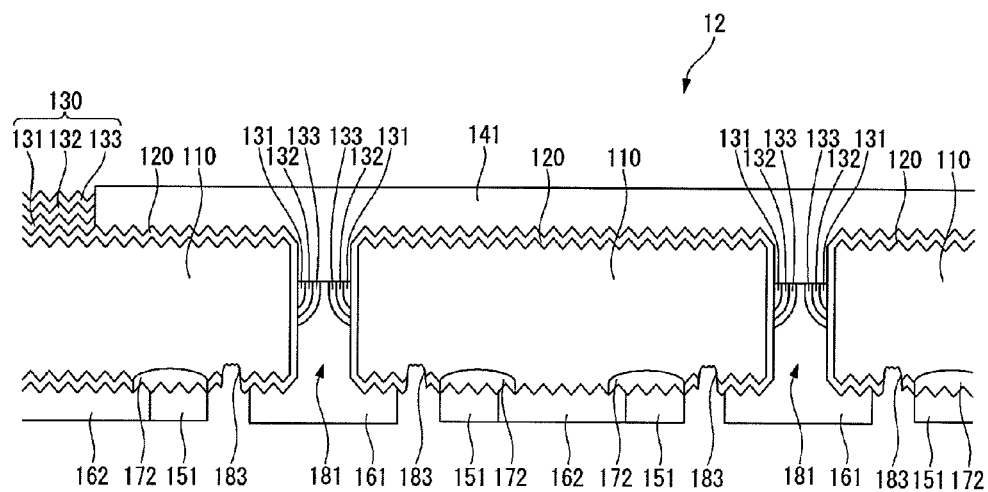
FIG. 4 is a cross sectional view obtained by cutting the solar cell of FIG. 1 along II-II line when the anti-reflection portion of the solar cell is made of a triple layer.

In another embodiment, as shown in FIG. 4, when the anti-reflection layer 130 has a triple layered structure such as first, second and third anti-reflection layers 131, 132 and 133, the number of layers formed varies according to an internal position of each via hole 181. Therefore, the number of layers laminated inside each via hole 181 is increased as a position of the via hole 181 that are closer to the area adjacent to where a process gas in the form of vaporized state is sprayed to form each layer of the anti-reflection layer 130, for example, the front surface of the substrate 110 of FIG. 4. Also, as shown in FIG. 4, even if the number of layers laminated inside the via hole 181 is the same, a thickness of each layer can be varied according to a position of the layer, namely, according to distance from where the process gas is sprayed. Therefore, as the layer is formed closer to the front surface of the substrate 110, namely, as spraying distance becomes short, a thickness of the layer laminated inside the via hole 181 is increased accordingly.

A part of the periphery of the front surface of the substrate 110 is exposed by an exposed part that is formed in the anti-reflection layer 130 and the emitter 120 underlying the anti-reflection layer 130. Therefore, the emitter 120 formed in the front surface of the substrate 110 and the emitter 120 formed in the back surface of the substrate 110 are separated electrically from the exposed part.

The plurality of front electrodes 141 are disposed on the emitter 120 formed at the front surface of the substrate 110, are connected to the emitter 120 electrically and physically, and extend in parallel with each other along a predetermined direction while being separated from each other.

In this instance, as shown in FIG. 1, since each front electrode 141 is also disposed on the via holes 181 formed in the substrate 110, portions of the front electrodes 141 are disposed inside the via holes 181 as shown in FIG. 2.

As shown in FIG. 2, a position of an end part of the front electrode 141 disposed inside the via hole 181 is different from a position of an end part of the anti-reflection layer 130 disposed inside the via hole 181. Thus, the end part of the anti-reflection layer 130 extending from the front surface of the substrate 110 to the inside of the via hole 181 is disposed much lower than the end part of the front electrode 141 extending from the front surface of the substrate 110 to the inside of the via hole 181. In this instance, positions of the end parts of the anti-reflection layer 130 and the front electrode 141 may be the same within a margin of error due to differences among heights of irregularities of the textured surface formed on the front surface of the substrate 110.

The plurality of front electrodes 141 collect charges which have moved toward the emitter 120 (for example, electrons) and deliver them to the plurality of front electrode bus bars 161 connected thereto through the via holes 181.

The plurality of front electrodes 141 contain at least one conductive material, and the conductive material may be at least one of nickel (Ni), copper (Cu), silver (Ag), aluminum (Al), tin (Sn), zinc (Zn), indium (In), titanium (Ti), gold (Au), and a combination of the above, or may contain a different material.

The plurality of front electrode bus bars 161 disposed on the back surface of the substrate 110 are made of at least one conductive material. The front electrode bus bars 161 extend in parallel to each other in a direction crossing the plurality of front electrodes 141 disposed on the front surface of the substrate 110, usually forming a stripe shape.

As shown in FIGS. 1 and 2, the plurality of via holes 181 are formed in the area where the plurality of front electrodes 141 and the plurality of front electrode bus bars 161 cross each other. A portion of the plurality of front electrodes 141 and/or the plurality of front electrode bus bars 161 is extended towards the front and/or back surfaces of the substrate 110 through the plurality of via holes 181. Thus, a plurality of front electrodes 141 and the plurality of front electrode bus bars 161 disposed opposite to each other are connected to each other. Accordingly, the plurality of front electrodes 141 and the plurality of front electrode bus bars 161 are connected to each other electrically and physically through the plurality of via holes 181.

The plurality of front electrode bus bars 161 output charges delivered from the plurality of front electrodes 141 connected electrically to the plurality of front electrode bus bars 161 to an external device.

In this embodiment of the invention, the plurality of front electrode bus bars 161 contain silver (Ag). On the contrary, the plurality of front electrode bus bars 161 may contain at least one selected from a group consisting of nickel (Ni), copper (Cu), aluminum (Al), tin (Sn), zinc (Zn), indium (In), titanium (Ti), gold (Au), and a combination of the above, or the plurality of front electrode bus bars 161 may contain a conductive material that is different from the above.

The back electrode 151 disposed on the back surface of the substrate 110 is disposed in such a way to be separated from the nearby plurality of front electrode bus bars 161.

The back electrode 151 is disposed on an area of the back surface of the substrate 110 when the plurality of front electrode bus bars 161 and the plurality of back electrode bus bars 162 are not formed. In this instance, the back electrode 151 is also not disposed at the periphery of the back surface of the substrate 110.

The back electrode 151 collects charges moving toward the substrate 110, for example, holes.

The emitter 120 disposed at the back surface of the substrate 110 exposes portions of the back surface of the substrate 110 and includes a plurality of exposed parts 183 surrounding the plurality of front electrode bus bars 161.

Due to the exposed parts 183, electrical connection between the plurality of front electrode bus bars 161 collecting electrons (or holes) and the back electrode 151 collecting holes (or electrons) are disconnected, facilitating proper movement of electrons and holes. In other words, since the plurality of front electrode bus bars 161 and the back electrode 151 collecting different types of charges are disconnected from each other, different types of charges (e.g., electrons and holes) which have moved respectively toward the plurality of front electrode bus bars 161 and the back electrode 151 are prevented or reduced from recombination.

The back electrode 151 contains at least one type of conductive material such as aluminum (Al). However, in an alternative embodiment, the back electrode 151 may contain at least one selected from a group consisting of nickel (Ni), copper (Cu), silver (Ag), tin (Sn), zinc (Zn), indium (In), titanium (Ti), gold (Au), and a combination of the above. The back electrode 151 may contain a conductive material different from the above.

The plurality of back electrode bus bars 162 are disposed on the back surface of the substrate 110 and are connected to the back electrode 151 electrically and physically, extending in parallel with the plurality of front electrode bus bars 161.

Therefore, the plurality of back electrode bus bar 162 collects charges delivered from the back electrode 151 (for example, holes) and outputs the charges to the external device.

Since the plurality of back electrode bus bars 162 are made of the same material as the plurality of front electrode bus bars 161, the plurality of back electrode bus bars 162 contain conductive material such as silver (Ag). However, in an alternative example, the plurality of back electrode bus bars 162 may contain at least one selected from a group consisting of nickel (Ni), copper (Cu), aluminum (Al), tin (Sn), zinc (Zn), indium (In), titanium (Ti), gold (Au), and a combination of the above. The plurality of back electrode bus bars 162 may contain a conductive material different from the above.

Also, in this embodiment of the invention, each of the plurality of back electrode bus bars 162 have a stripe shape extending along a predetermined direction from each of the front electrode bus bars 161, but at a distance thereof.

In FIG. 1, the number of each of the plurality of front electrodes 141, the plurality of front electrode bus bars 161, and the plurality of back electrode bus bars 162 that are disposed on the substrate 110 is only an example, and may be changed depending on the case.

In other words, as described above, since the plurality of front electrode bus bars 161 and the plurality of back electrode bus bars 162 are disposed in an alternate fashion with a predetermined space in the back surface of the substrate 110, the back electrode 151 is disposed between the front electrode bus bar 161 and the back electrode bus bar 162. In this instance, for electrical insulation of the back electrode 151 and the plurality of front electrode bus bars 161, the exposed parts 183 are formed along the plurality of front electrode bus bars 161, and thereby portions of the substrate 110 are exposed through the exposed parts 183. Accordingly, the back electrode bus bars 162 are separated from the front electrode bus bars 161 that collect different kind of charges, thereby reducing a recombination rate of electrons and holes.

Different from this embodiment, portions of the back electrode 151 and the back electrode bus bars 162 may be overlapped with each other in other embodiments. For example, a portion of the periphery of the back electrode bus bar 162 may be disposed on the back electrode 151, or, on the other hand, portions of the back electrode 151 may be disposed on the back electrode bus bars 162. In this instance, a contact area between the back electrode 151 and the back electrode bus bars 162 increases, and thus, contact resistance between the back electrode 151 and the back electrode bus bars 162 is reduced, and charge transfer from the back electrode 151 to the back electrode bus bars 162 is reliably increased due to a stable contact therebetween.

In an alternative example, each back electrode bus bar 162 may have a plurality of conductors in the shape of islands disposed with a regular spacing along a predetermined direction. In this instance, each cross sectional shape of the plurality of conductors may take various forms such as rectangular, triangular, circular, or ellipsoidal shape. In this instance, too, each conductor may overlap with portions of the back electrode 151.

The back surface electric field unit 172 is formed in an area where impurities of the same conductivity type as the substrate 110 are doped locally on the back surface of the substrate 110 with a higher concentration than that of the substrate 110 (for example, the back surface electric field layer 172 is a p+ area). Since the back surface electric field unit 172 is usually disposed at the back surface of the substrate 110 contacting the back electrode 151, the back electrode 151 is electrically connected to the substrate 110 through the back surface electric field unit 172.

Due to the difference of impurity density between the substrate 110 and the back surface electric field unit 172, an electric potential barrier is established. Accordingly, while a movement of electrons is hindered toward the back surface electric field unit 172 which is the movement direction of holes, a movement of holes toward the back surface electric field unit 172 is facilitated. Therefore, the amount of charges lost due to recombination of electrons and holes at the back surface of the substrate 110 and its adjacent area is reduced, and a movement of required charges (e.g., holes) is accelerated, thereby increasing the amount of movement of charges toward the back electrode 151 and the back electrode bus bars 162.

Also, since the back electrode 151 contacts the back surface electric field unit 172 that maintains a higher impurity density than that of the substrate 110, contact resistance between the substrate 110, namely the back surface electric field unit 172, and the back electrode 151 is reduced and thus, efficiency of charge transfer from the substrate 110 to the back electrode 151 is improved.

An operation of the solar cell 11 having the structure as described above according to an embodiment of the invention will be described below.

When light rays are incident on the solar cell 11 and reach the semiconductor substrate 110 through the emitter 120, electron-hole pairs are generated in the semiconductor substrate 110 due to light energy. In this instance, since the surface of the substrate 110 is a textured surface, light reflectivity is reduced at the front surface of the substrate 110 and the amount of light incident on the substrate 110 is increased. Furthermore, since reflection loss of light incident on the substrate 110 is reduced due to the anti-reflection layer 130, the amount of light incident on the substrate is all the more increased.

The electron-hole pairs are separated from each other due to the p-n junction between the substrate 110 and the emitter 120, and the electrons move toward the emitter 120 of the n-type while the holes move toward the substrate 110 of the p-type. In this way, the electrons, which have moved toward the emitter 120, are collected by the plurality of the front electrodes 141 and move toward the plurality of front electrode bus bars 161 connected through the plurality of via holes 181, and the holes, which have moved toward the substrate 110, are collected by the back electrode 151 through the back surface electric field unit 172 and move to the plurality of back electrode bus bars 162. When the plurality of front electrode bus bars 161 and the plurality of back electrode bus bars 162 are connected by electric wires, current flows through the electric wires and may be used by an external device as electric power.

In this embodiment, since the plurality of front electrode bus bars 161 are disposed at the back surface of the substrate 110 where light rays do not reach, an incident area of light is increased and thus, efficiency of the solar cell 11 is increased.

In this embodiment, inside the via hole 181, the first electrode bus bar 161 contacts a portion of the anti-reflection layer 130 that is inside the via hole. Such is due to the anti-reflection layer 130 including a first portion that is disposed on the first surface of the substrate 110, and a second portion that is inside the via hole 181. The first portion of the anti-reflection layer 130 is discontinuous from the second portion. Additionally, a portion of the first electrode bus bar 161 that is disposed in the via hole 181 covers the second portion of the anti-reflection layer 130. The second portion of the anti-reflection layer 130 also contacts a portion of the first electrode 141 that is in the via hole 181, a portion of the first electrode bus bar 161 that is in the via hole 181, and a portion of the emitter layer 120 that is in the via hole 181.

Next, with reference to FIGS. 3A to 3H, a method for manufacturing a solar cell 11 according to one embodiment of the invention will be described.

Figure 3A:
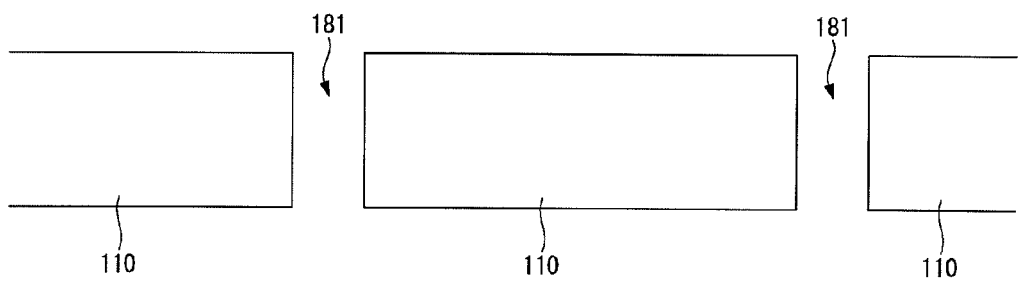
FIGS. 3a to 3h are cross-sectional views that sequentially illustrate each of stages in a method for manufacturing a solar cell according to an example embodiment of the invention.

As shown in FIG. 3A, first, a plurality of via holes 181 are formed on a substrate 110 made of, for example, p-type monocrystalline or polycrystalline silicon. In this instance, the via holes 181 are made by laser drilling formed by irradiating a laser beam, but is not limited to the above.

Figure 3B:
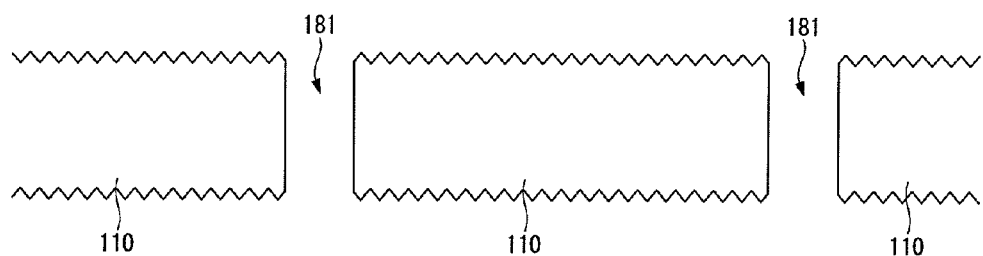

Next, as shown in FIG. 3B, the entire front surface of the substrate 110 is textured, forming a textured surface. As shown in FIG. 3B, the textured surface is not formed on the side walls of via holes 181. In this instance, when the substrate 110 is made of monocrystalline silicon, surface of the substrate 110 is textured by using a sodium hydroxide solution such as KOH, NaOH, and TMAH. On the other hand, when the substrate 110 is made of polycrystalline silicon, the surface of the substrate 110 is textured by using an acid solution such as HF or $HNO_3$. The back surface of the substrate 110 may also be textured, but such is not required.

Figure 3C:
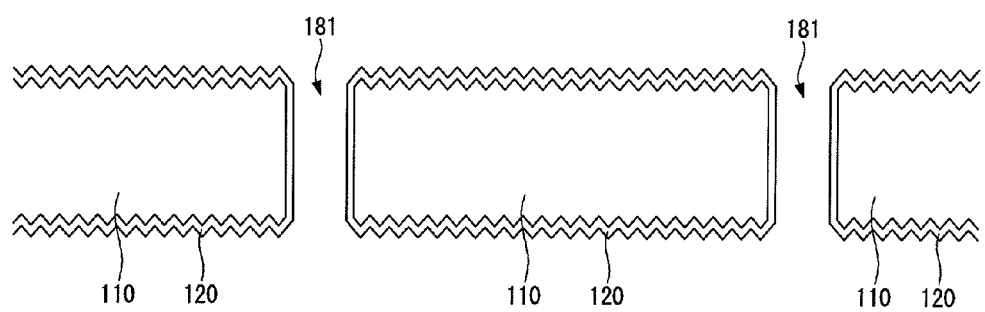

Next, as shown in FIG. 3C, by applying a heat treatment to the substrate 110 and a material containing impurities of a group V element such as phosphorus (P), arsenic (As), and antimony (Sb) (for example, $POCl_3$ or $H_3PO_4$) at a high temperature, the impurities of the group V element are diffused into the substrate 110, thereby forming an emitter 120 on the entire surfaces of the substrate 110, namely, a front surface, a back surface, side surfaces, as well as the inside surfaces of the via holes 181 of the substrate. Different from this embodiment of the invention, when the conductivity type of the substrate 110 is an n-type in another embodiment of the invention, by applying the heat treatment to the material containing impurities of a group III element (for example, $B_2H_6$) at a high temperature, a p-type emitter 120 may be formed on the front surface of the substrate 110. Next, phosphorous silicate glass (PSG) or boron silicate glass (BSG) that are formed as the n-type or the p-type impurities that are diffused into the inside of the substrate 110, may be removed through an etching process.

Figure 3D:
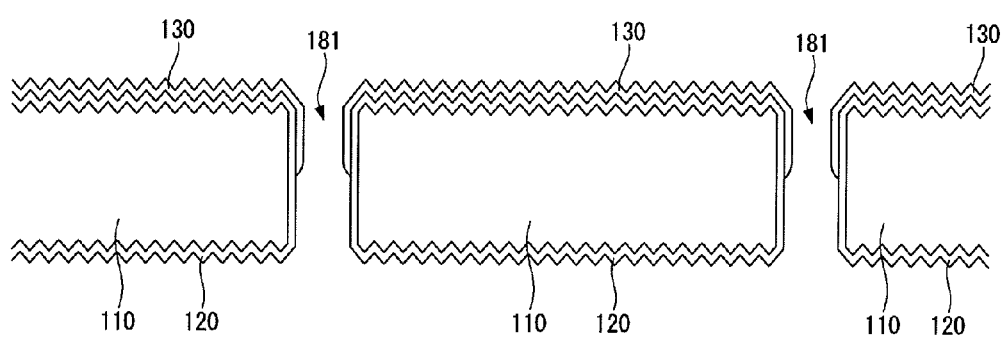

Next, as shown in FIG. 3D, by using plasma enhanced chemical vapor deposition (PECVD) or chemical vapor deposition (CVD), an anti-reflection layer 130 is formed at the front surface of the substrate 110 and the inside of via holes 181. In this instance, as shown in FIG. 3D, the anti-reflection layer 130 extends from the front surface of the substrate 110 to a position of some depth of the via holes 181, and thus, a portion of the anti-reflection layer 130 occupies a part of the inside (or inside wall) of each via hole 181. In other embodiments, the anti-reflection layer 130 may occupy the whole inside area (or inside wall) of the via hole 181.

With reference to FIG. 4, the anti-reflection layer 130 having a multi-layer structure such as triple layers 131-133 may be formed by changing a process gas in the same process room (e.g., a chamber) or by using a PECVD method in separate process rooms, the first to third anti-reflection layers 131-133 may be formed sequentially.

In another embodiment of the invention, the anti-reflection layer 130 may be formed by a sol-gel method such as a spin coating method or a spray coating method.

Figure 3E:
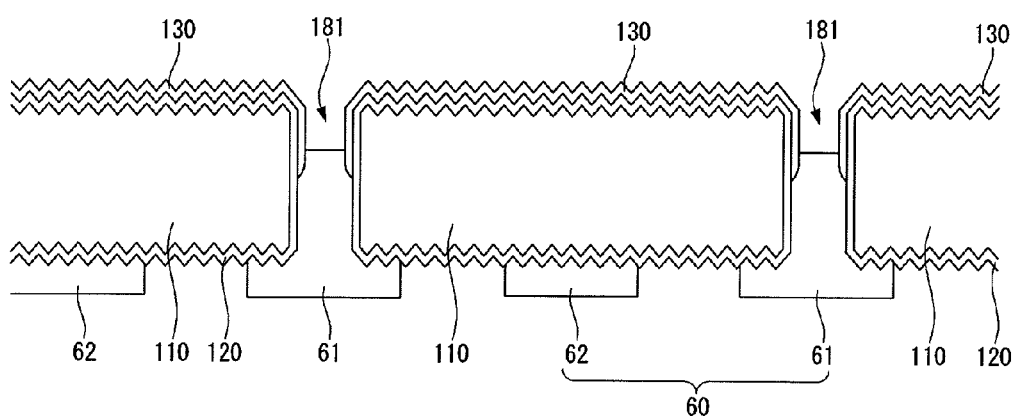

Next, as shown in FIG. 3E, by using a screen printing method, a paste containing silver (Ag) is printed in a corresponding part on the back surface of the substrate 110 and is then dried, to form a bus bar pattern 60 on the back surface of the substrate 110. The bus bar pattern 60 includes a plurality of front electrode bus bar patterns 61 and a plurality of back electrode bus bar patterns 62.

In this instance, the front electrode bus bar patterns 61 are printed after the via holes 181 are formed and are printed on portions of the back surface of the substrate 110, at which the via holes 181 are formed, and thereby the front electrode bus bar patterns 61 are filled into at least one part of the inside of the corresponding via hole 181.

Figure 3F:
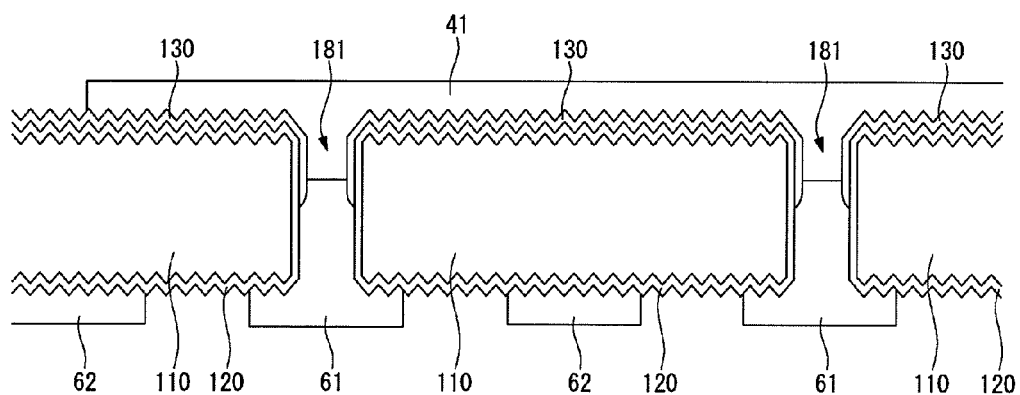

Next, as shown in FIG. 3F, by using a screen printing method, a paste containing silver (Ag) is printed on corresponding parts on the anti-reflection layer 130 disposed on the front surface of the substrate 110, and thereby a plurality of front electrode patterns 41 extending in parallel to each other along a predetermined direction on the anti-reflection layer 130 are formed by drying the printed paste. In this instance, as the paste is also printed on the plurality of via holes 181, the remaining part of each via hole 181 unfilled by the front electrode bus bar patterns 61 may be filled up, though such is not required. Accordingly, the front electrode patterns 41 contact the front electrode bus bar patterns 61 already existing inside the via holes 181. In this instance, the front electrode patterns 41 contain silver (Ag). The length of an end part of the front electrode pattern 41 extending from the front surface of the substrate 110 to the via hole 181 (or to a certain position in the via hole 181) is shorter than that of an end part of the anti-reflection layer 130 extending from the front surface of the substrate 110 to the via hole 181 (or to another position in the via hole 181).

Figure 3G:
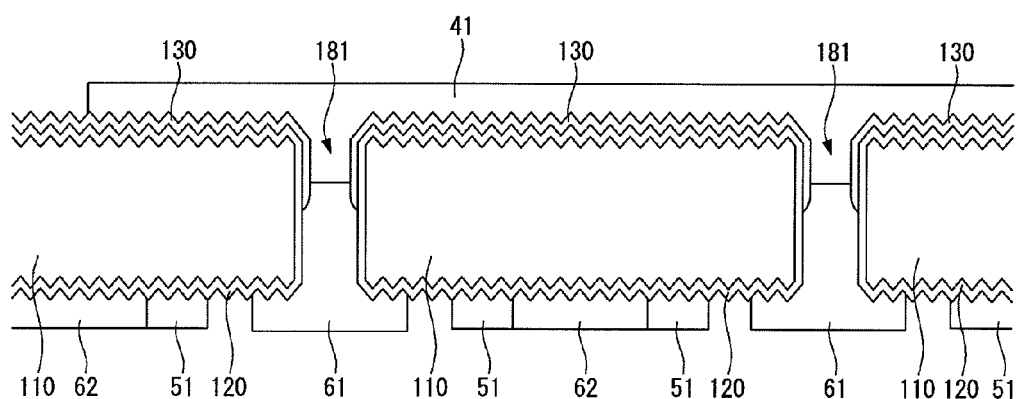

Next, as shown in FIG. 3G, by using a screen printing, a paste containing aluminum (Al) is printed on corresponding parts on the back surface of the substrate 100 in such a way that the paste is separated from the front electrode bus bar patterns 61 and extends in parallel with the front electrode bus bar patterns 61, and thereby a back electrode pattern 51 is formed after drying the printed paste.

As described above, one or more of the pastes for the front electrode patterns 41, the bus bar pattern 60, and the back electrode pattern 51 may contain glass frit as well as metal power such as silver (Ag) or aluminum (Al). The bus bar pattern 60 and the back electrode pattern 51 are formed by using different pastes (e.g., pastes having different compositions) from each other.

For example, while the paste for front electrode patterns 41 has a property of penetrating a layer such as the anti-reflection layer 130 underlying the front electrode patterns 41 through a heat treatment, the paste for the bus bar pattern 60 and the back electrode pattern 51 does not have a property of penetrating a layer underlying the bus bar pattern 60 and the back electrode pattern 51 during a heat treatment. As an example, the layer penetration property of the paste may be controlled by adjusting the amount of lead (Pb) contained in the glass frit.

In this instance, a drying temperature of the patterns 41, 51 and 60 may range about 120° C. to 200° C. and a formation order of the patterns 41, 51 and 60 may be changed.

Next, a heat treatment process is applied to the substrate 110 having the front electrode patterns 41, the back electrode pattern 51, and the bus bar pattern 60 at a temperature of about 750° C. to 800° C.

Figure 3H:
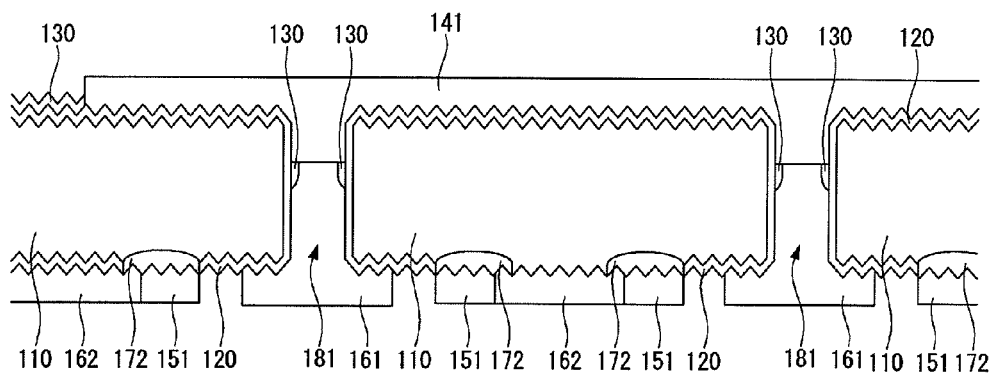

Accordingly, formed are a plurality of front electrodes 141 connected to the emitter 120, a plurality of front electrode bus bars 161 connected to a plurality of front electrodes 141 through a plurality of via holes 181, a back electrode 151 connected electrically to the substrate 110, a plurality of back electrode bus bars 162 connected to the substrate 110 and the back electrode 151, and a back surface electric field unit 172 disposed in (at) the back surface of the substrate 110 contacting the back electrode 151, as shown in FIG. 3H.

In other words, in the heat treatment process, by the glass frit including lead (Pb) contained in the front electrode patterns 41, the front electrode patterns 41 form the plurality of front electrodes 141 contacting the emitter 120 by penetrating the anti-reflection layer 130 at a contact area thereof.

In this instance, since the anti-reflection layer 130 (or portions thereof) is disposed inside the plurality of via holes 181, prevented or reduce is the occurrence of a shunt failure where the front electrodes 141 contact the substrate 110 by penetration of the emitter 120 inside the via holes 181 during the heat treatment process.

In other words, when the anti-reflection layer 130 (or portions thereof) is not disposed inside the via holes 181 and the penetrating operation of the anti-reflection layer 130 due to the heat treatment process is carried out, the front electrode patterns 41 disposed inside the via holes 181 contacts the substrate 110 by penetrating the emitter 120 formed inside the via holes 181 from the operation of the glass frit containing lead (Pb). Therefore, a shunt failure occurs and accordingly, parallel resistance of the solar cell 11 is increased and efficiency of the solar cell 11 is reduced along with reduction of a short circuit current (Isc).

However, as described in the example, since the anti-reflection layer 130 is disposed not only on the front surface of the substrate 110 but also inside the via holes 181, when the penetrating operation of the front electrode patterns 41 disposed inside via holes 181 is carried out, the front electrode patterns 41 penetrate the anti-reflection layer 130 underlying the front electrode patterns 41, even within the via holes 180, and thereby contacts the emitter 120 in a stable manner. Therefore, since the shunt failure is prevented or reduced due to the anti-reflection layer 130 disposed inside the via holes 181, efficiency of the solar cell 11 is improved.

In this instance, since a position of the end part of the anti-reflection layer 130 extending from the front surface of the substrate 110 to the inside of the via holes 181 is lower than that of the end part of the front electrode pattern 41 extending from the front surface of the substrate 110 to the inside of the via holes 181, the emitter 120 is protected by the anti-reflection layer 130 disposed inside the via holes 181, and occurrence of a leaking current due to the shunt failure caused by damage of the emitter 120 from the penetrating operation of the front electrode patterns 41 during the heat treatment process is prevented.

Also, due to the heat treatment, the back electrode pattern 51 form the back electrode 151, and the bus bar pattern 60 form the plurality of front electrode bus bars 161 and the plurality of back electrode bus bars 162. In this instance, the front electrode bus bar patterns 61 of the bus bar pattern 60 become the plurality of front electrode bus bars 161 while the plurality of back electrode bus bar patterns 62 of the bus bar pattern 60 become the plurality of back electrode bus bars 162. In this instance, since the glass frit of the back electrode pattern 51 and the bus bar pattern 60 does not contain lead (Pb), the penetrating operation against the layer underlying the back electrode pattern 51 and the bus bar pattern 60, namely the emitter 120, is not carried out, but only a chemical combination between metal components contained in the patterns 51 and 60 and the layer (i.e., the emitter 120) contacting the metal components occur. Accordingly, contact resistance against the substrate 110 is reduced and efficiency of charge transfer is improved, thereby increasing current flow.

Also, during the heat treatment, aluminum (Al) contained in the back electrode pattern 51 is diffused into the substrate 110, and the back surface electric field unit 172, which is an impurity area having higher impurity density than that of the substrate 110, is formed inside the substrate 110.

Next, by using a laser, for example, a plurality of exposed parts 183 are formed in the emitter 120 at the back surface of the substrate 110 and at portions of the substrate 110 underlying the emitter 120, thereby completing the solar cell 11 (see FIGS. 1 and 2). In this instance, the exposed parts 183 are formed around the front electrode bus bars 161 and thus, the back electrode 151 and the front electrodes 141 are separated electrically from each other.

Also, when the plurality of exposed parts 183 are formed, the emitter 120 formed on side surfaces of the substrate 110 is removed by removing parts of the side surfaces of the substrate 110. Accordingly, an edge isolation is carried out whereby parts of the substrate 110 is exposed by forming an exposed part along the periphery of the front surface of the substrate 110. Accordingly, the emitter 120 disposed in the front surface of the substrate 110 and the emitter 120 disposed in the back surface of the substrate 110 are separated electrically, thereby reducing the amount of loss due to recombination of charges.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
   a substrate of a first conductivity type, the substrate having a via hole;
   an emitter disposed at the substrate and the via hole, and having a second conductivity type that is opposite the first conductivity type;
   an anti-reflection layer disposed on a first surface of the substrate and inside the via hole, the anti-reflection layer including a first portion disposed on the first surface of the substrate and a second portion disposed inside the via hole;
   a first electrode disposed on the first surface of the substrate and in the via hole and the first electrode directly contacted to the emitter between the first surface and a second surface of the substrate in the via hole;
   a first electrode bus bar disposed on the second surface of the substrate and in the via hole; and
   a second electrode disposed on the second surface of the substrate and connected to the substrate,
   wherein the first electrode and the first electrode bus bar are disposed between the first surface and the second surface of the substrate in the via hole,
   the second portion of the anti-reflection layer is entirely disposed near a contact point between the first electrode and the first electrode bus bar and nowhere else,
   materials of the second portion of the anti-reflection layer equals materials of the first portion of the anti-reflection layer, and
   an upper side surface of the first electrode bus bar disposed besides the contact point contacts with the second portion of the anti-reflection layer and a lower side surface which is not the upper side surface of the first electrode bus bar contacts with the emitter inside the via hole.

2. The solar cell of claim 1, wherein a position of an end part of the second portion of the anti-reflection layer disposed inside the via hole is lower than a position of an end part of the first electrode extending from the first surface to the inside of the via hole.

3. The solar cell of claim 1, wherein the anti-reflection layer comprises at least one layer.

4. The solar cell of claim 3, wherein the anti-reflection layer includes at least one of silicon nitride, silicon oxide, aluminum oxide, titanium oxide, and silicon oxynitride.

5. The solar cell of claim 3, wherein the anti-reflection layer includes a plurality of layers, and
wherein a number of layers of the second portion of the anti-reflection layer existing inside the via hole at a position that is closer to the first surface of the substrate is greater than a number of layers of the second portion of the anti-reflection layer existing inside the via hole at a position that is farther from the first surface of the substrate.

6. The solar cell of claim 1, further comprising a second bus bar disposed on the second surface of the substrate and connected to the second electrode.

7. The solar cell of claim 1, wherein, inside the via hole, the first electrode bus bar contacts the second portion of the anti-reflection layer that is inside the via hole.

8. The solar cell of claim 1, wherein a portion of the first electrode bus bar that is disposed in the via hole covers the second portion of the anti-reflection layer existing inside the via hole.

9. The solar cell of claim 1, wherein the second portion of the anti-reflection layer existing inside the via hole contacts a portion of the first electrode that is in the via hole, a portion of the first electrode bus bar that is in the via hole, and a portion of the emitter layer that is in the via hole.

10. The solar cell of claim 1, wherein the first electrode includes a glass frit that contains lead and at least one of the first electrode bus bar and the second electrode includes a glass frit that does not contain lead.

11. The solar cell of claim 1, wherein the first electrode includes a different material from a material of the first electrode bus bar.

* * * * *